US005813331A

United States Patent [19]

Tan et al.

[11] Patent Number: 5,813,331

[45] Date of Patent: Sep. 29, 1998

[54] METHOD OF PRINTING WITH A DIFFERENTIAL THICKNESS STENCIL

[75] Inventors: Teik Jin Tan; Lam Cheow Aun; Ka Tiek Lim, all of Penang, Malaysia

[73] Assignee: Motorola, Inc., Schaumburg, Ill.

[21] Appl. No.: 951,869

[22] Filed: Oct. 16, 1997

Related U.S. Application Data

[63] Continuation of Ser. No. 645,404, May 13, 1996, abandoned.

[30] Foreign Application Priority Data

Sep. 22, 1995 [MY] Malaysia ............................ PI9502828

[51] Int. Cl.[6] ........................ B41M 1/12

[52] U.S. Cl. ........................ 101/129; 101/127

[58] Field of Search ........................ 101/127, 128.21, 101/128.4, 129

[56] References Cited

U.S. PATENT DOCUMENTS

| | | | |
|---|---|---|---|
| 4,135,020 | 1/1979 | Maxwell | 101/127 |
| 4,270,465 | 6/1981 | Lim | 101/127 |
| 4,872,261 | 10/1989 | Sanyal et al. | 101/127 |
| 4,930,413 | 6/1990 | Jaffa | 101/127 |
| 5,368,883 | 11/1994 | Beaver | 101/128.21 |
| 5,593,080 | 1/1997 | Teshima et al. | 101/127 |

FOREIGN PATENT DOCUMENTS

| | | | |
|---|---|---|---|
| 124698 | 9/1980 | Japan | 101/127 |
| 37465 | 2/1986 | Japan | 101/127 |
| 34395 | 2/1990 | Japan | 101/128.21 |
| 144191 | 5/1992 | Japan | 101/128.4 |

OTHER PUBLICATIONS

RCA Technical Notes, "A Metal Mask and Screen Assembly," Balents, TN No. 978, Sep. 17, 1974, pp. 1–2. Class 101 Sub 127.

*Primary Examiner*—Stephen R. Funk
*Attorney, Agent, or Firm*—Barbara R. Doutre

[57] ABSTRACT

A differential thickness stencil (14') integrally formed from two sieves (601 and 602) having different thicknesses (701 and 702) for a two-stage solder printing process for printing the solder mask for a fine-pitch component alongside that of a larger component. The differential thickness stencil (14') includes a first sieve (602) having at least one through-hole (142) of a first height (702) from a top surface portion (722) of the stencil to the bottom surface (714) of the stencil. This first sieve (702) has at least one inverted well (742) having an opening on the bottom surface (744) and having a second height (746) lower than the first height (702) starting from the bottom surface (714) to an underside ceiling (746) of the top surface of the stencil. A second sieve (601) is integrally joined (603) to the first sieve (602) but this second sieve (601) has at least a second through-hole (142') of a third height (701) from a second top surface portion (711) of the stencil to the bottom surface (714)of the stencil. This third height (701)is lower than the second height of the inverted well (742) of the first sieve (602). Furthermore, this second through-hole (142') corresponds to the location of the inverted well (742).

2 Claims, 5 Drawing Sheets

METHOD OF PRINTING WITH A DIFFERENTIAL THICKNESS STENCIL

This is a continuation of application Ser. No. 08/645,404, filed May 13, 1996, and now abandoned.

CROSS REFERENCE TO RELATED APPLICATION

This application is related to U.S. Ser. No. 08/645,402, filed May 13, 1996 by Aun et al., now U.S. Pat. No. 5,724,889, entitled "Stencil Shifter", U.S. Ser. No. 08/645,403, filed May 13, 1996 by Teoh et al., now U.S. Pat. No. 5,713,276, entitled "Flexible Self-Level Squeegee Blade", and U.S. Ser. No. 08/645,405, filed May 13, 1996 by Tan et al., now abandoned, entitled "Paste Retainer", all related to corresponding applications previously filed in Malaysia, assigned to Motorola, Inc. and filed concurrently herewith.

TECHNICAL FIELD

This invention relates in general to stencils and in particular to stencils for printing paste by a Surface Mount Technology (SMT)printer on a substrate.

BACKGROUND

Screen printing on substrates, such as printed circuit boards (PCBs) for Surface Mount Technology (SMT)is well-known.

Referring to FIGS. 1–4, films or pastes of various materials, such as solder, can be deposited by screen or stencil printing. The screen printer is a precision apparatus that provides for mounting or setting-up a screen or stencil 14, positioning the screen relative to a substrate 32 in x, y, and z directions, and a rolling angle, positioning a squeegee 16 having a squeegee blade 18 attached relative to the screen, positioning and moving a vacuum tower 42 that supports the substrate 32, and moving the squeegee 16 with a controlled speed. The stencil 14 of FIG. 1 is typically constructed of a uniformly stamped stainless steel and etched with a through-hole pattern in the regions in which a paste is to be printed through the etched through-holes or holes 142 of the stencil 14. For reproducible quality printing, the screen or stencil tension and surface must be uniform and held down by an aluminum frame 146.

In FIG. 2 showing the current process, a blank printed circuit board 32 is conveyed into proper position over the substrate conveyor 42, preferably a vacuum tower, and under the stencil 14, by a printer rail 44 with the guidance of a vision camera 46. After a reservoir of paste 12 is deposited on the stencil 14 by a paste dispenser, the vacuum tower 42 is raised in FIG. 3 to position the supported substrate 32 in direct contact with and below the pattern-marked portion of the stencil 14, such that the pattern portion of the stencil 14 is brought in contact with the substrate 32 in the area under the squeegee 16 stroke and the paste 12 is forced through the through-holes 142 of the stencil 14 by the squeegee blade 18. After the squeegee sweep during which the paste comes in contact with the substrate, the paste wets the substrate, leaving the paste that was in the holes of the stencil deposited on the substrate in the desired pattern.

At the end of the printing process, the vacuum tower 42 is lowered in FIG. 4 to re-position the supported substrate 32 back onto the printer rail for the rail to move the printed board 32 to the next assembly sequence stage of the board, such as a pick-and-place machine.

However, as the substrate size and line-width definition of the pattern usually called pitch become smaller, with the advance of microelectronics, controlling the quality of the printing process becomes more complex. The fine pitch printing process is a major roadblock towards miniaturization of PCB assemblies. Many fine pitch printing industries are facing the problem of how to deposit the smaller volume of paste needed for a smaller component, such as 0.5 millimeters (mm), alongside the larger volume of paste needed for a larger component on a single printed circuit board. The quality problems faced include the smearing and sticking of solder paste on the underside of the stencil during printing. The stencil has to be wiped clean after almost every printing cycle to reduce the smearing and sticking of solder paste. These problems are even more severe for the ultra-fine pitch components of 0.4 mm and 0.3 mm. Current state-of-the-printing art is almost incapable of printing these 0.3 mm and 0.4 mm extra small components.

Accordingly, a need exists to overcome the problems associated with not only ultra-fine printing but also with the differential deposition of small paste volume for fine pitch components together with a larger paste volume for larger components on a single PCB surface.

SUMMARY OF THE INVENTION

Briefly, according to the invention, there is provided a mixed-pitch metal stencil integrally formed from two sieves having different thicknesses for a two-stage solder printing process for printing the solder mask for a fine-pitch component alongside that of a larger component.

In accordance with one aspect of the invention, a differential thickness stencil includes a sieve having at least one through-hole of a first height from a top surface portion of the stencil to the bottom surface of the stencil. This sieve has at least one inverted well having an opening on the bottom surface and having a second height lower than the first height starting from the bottom surface to an underside ceiling of the top surface of the stencil.

In another aspect of the invention, the differential thickness stencil includes a second sieve integrally joined to the first sieve but this second sieve has at least a second through-hole of a third height from a second top surface portion of the stencil to the bottom surface of the stencil. Furthermore, this third height is lower than the second height of the inverted well of the first sieve.

DETAILED DESCRIPTION OF THE PREFERRED EMBODIMENT

Figure 1:
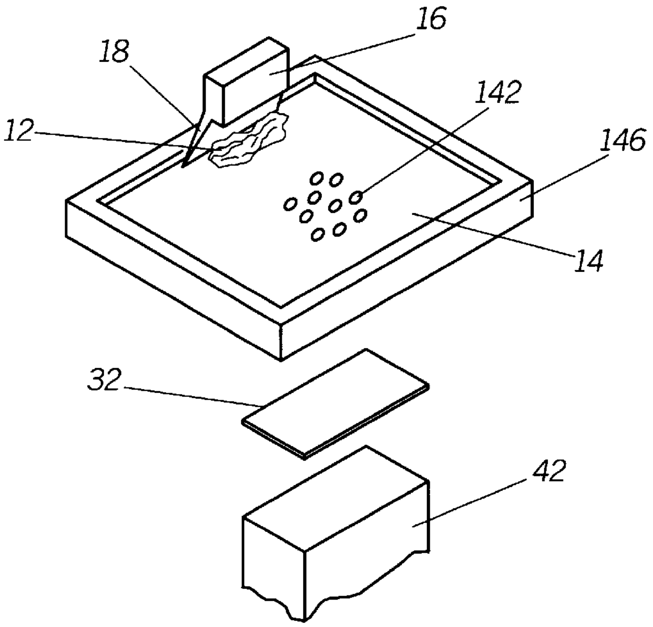
FIG. 1 is a simplified representation of a prior art paste printer.
Figure 2:
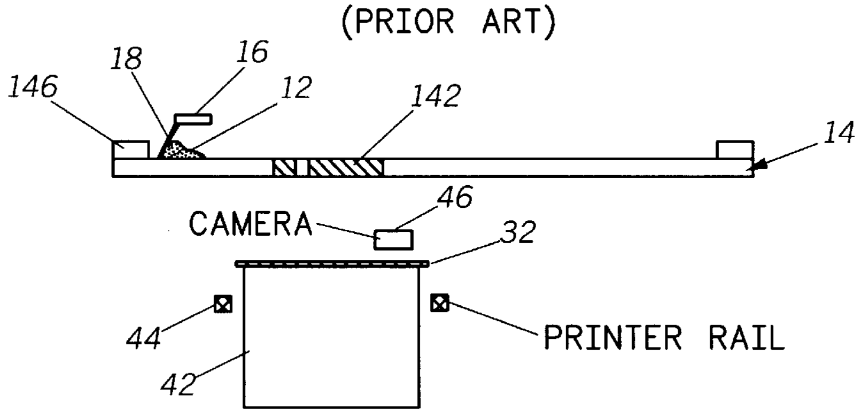
FIGS. 2–4 is a simplified representation of the current paste printing process.
Figure 3:
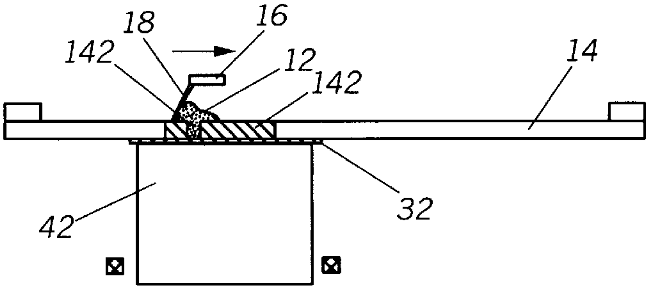
Figure 4:
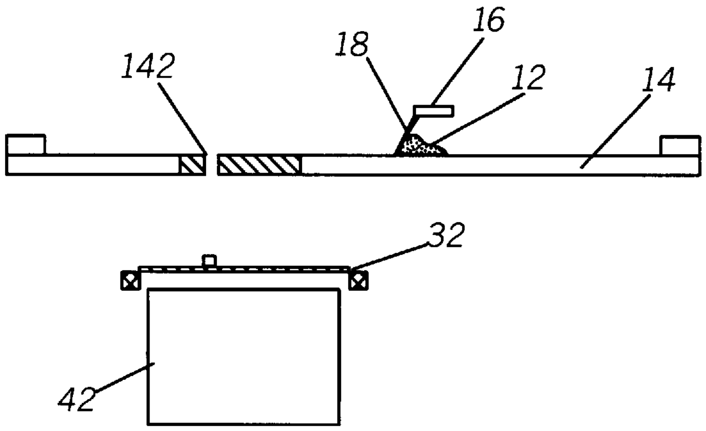
Figure 5:
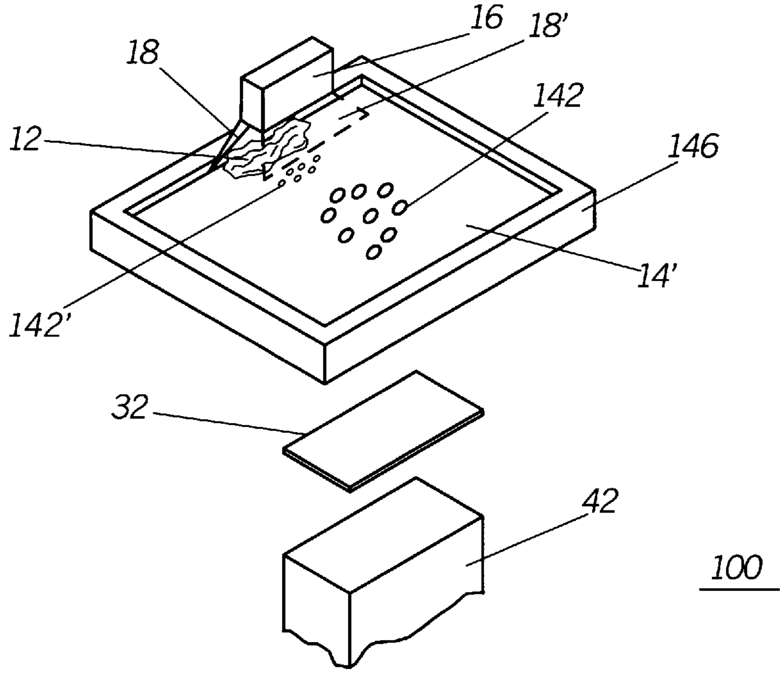
FIG. 5 is a simplified representation of a paste printer in accordance with the present invention.

Referring to FIG. 5, there is shown a simplified representation of a paste printer 100 in accordance with the present invention. Like numerals have been carried forth where applicable. Paste printer 100 is shown for printing solder paste on a substrate, such as a blank printed circuit board (PCB) 32 for later surface placement of electronic components on the solder pasted PCB, as part of the Surface Mount Technology (SMT). A squeegee 16, with one or two blades 18 and 18', laterally moves, in one or two respective directions, and serves as the movement controller for wiping the squeegee blade 18 or 18' across a covered substrate. Stencil 14', formed in a manner to be described herein, provides for the mixed pitch dispensing of solder paste onto substrate 32 in accordance with the present invention. Stencil 14' will also be referred to as mixed-pitch metal stencil 14' and differential thickness stencil 14'.

The conventional stencil, previously described in FIGS. 1–4, is made of a solid piece of rigid metal. As the stencil's thickness or height is uniform along its length, the height of paste deposited through the through-holes of the stencil is also uniform. Since the volume of deposited paste has to be governed by an optimized aspect ratio of height to width, the uniform height of paste deposited will also limit the minimum width allowable for the paste volume. Hence, this uniform stencil height does not allow the mixed printing for ultra-fine pitch lines alongside a wider line.

Figure 6:
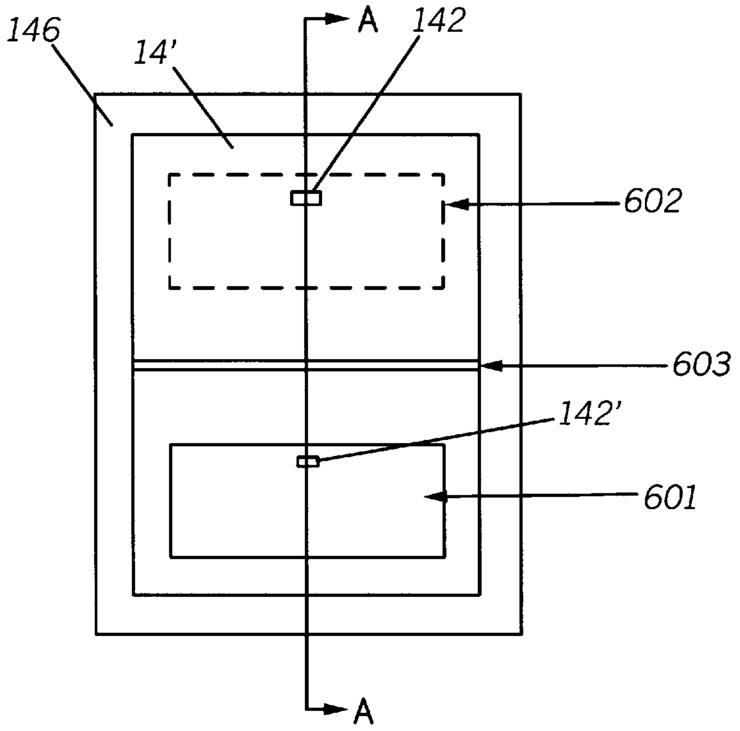
FIG. 6 is a top view of the stencil of FIG. 5.
Figure 7:
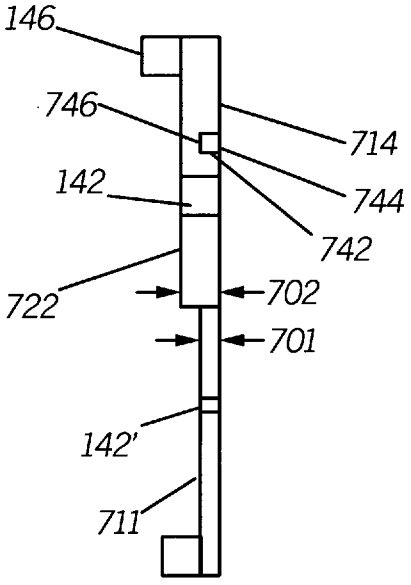
FIG. 7 is a cross-sectional side-view of line A—A of the stencil of FIG. 6.

Referring to FIGS. 5–7, the mixed-pitch metal stencil 14' for printing with a squeegee 16 of a solder paste printer, in accordance with the teachings of the present invention is represented. Stencil 14' is formed of a substantially rigid material, preferably a rigid metal plate, having at least first and second portions of different thicknesses. At least one through-hole 142' having one height 701 is etched on the portion of the metal stencil 14' having the same first height 701 for forming a first sieve or shim 601. Alongside the first sieve 601, at least another through-hole 142 having a second height 702 is etched on a second sieve portion 602 of the metal stencil 14' to provide for mixed-pitch stencil printing. Thus, two metal shims having different thicknesses are combined in one integral stencil.

The first height or thickness 701 of the first through-hole 142' of the first sieve 601 is measured from a first top surface portion 711 of the stencil to a bottom surface 714 of the stencil. The second height or thickness 702 of the second through-hole 142 of the second sieve 602 is measured from a second top surface portion 722 of the stencil to the same bottom surface 714 of the stencil. However, the second height 702 is higher than the first height 701 to enable the solder deposition through a bigger through-hole 142 as opposed to the smaller through-hole 142' aspect ratio limited by the lower height 701. In addition, the second sieve 602 has at least an inverted well, cavity, or blind-via 742 having an opening 744 on the bottom surface corresponding to the location of the first through-hole 142' of the first sieve 601. This inverted well 742 has a third height between the first and second heights starting from the bottom surface 714 to an underside ceiling 746 of the second top surface 722.

Preferably the first height 701 of the first sieve 601 is between three and four mils for stencil printing the solder mask for the ultra-fine components while the second height 702 of the second sieve 602 is between seven and eight mils for stencil printing the solder mask for the larger components. The blind-via or inverted well of the second sieve 602 preferably measures five mils from the bottom stencil surface 714. However, in actuality these height differences in mils can not be detected by the human eye as seen in FIGS. 8–12 where the width differences of the through-holes and cavities are exaggerated to differentiate between the two sieves.

Figure 8:
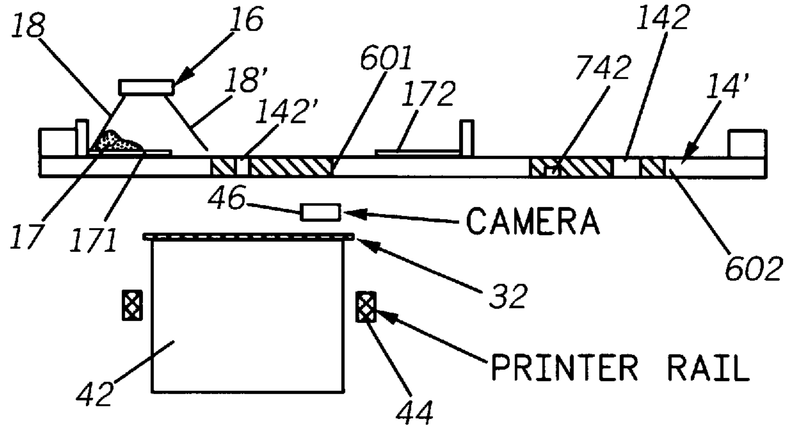
FIGS. 8–12 is a simplified representation of the two-stage paste printing process using the paste printer of FIG. 5, in accordance with the present invention.
Figure 9:
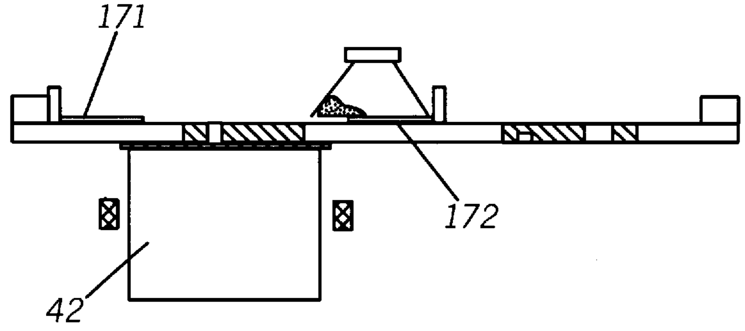
Figure 10:
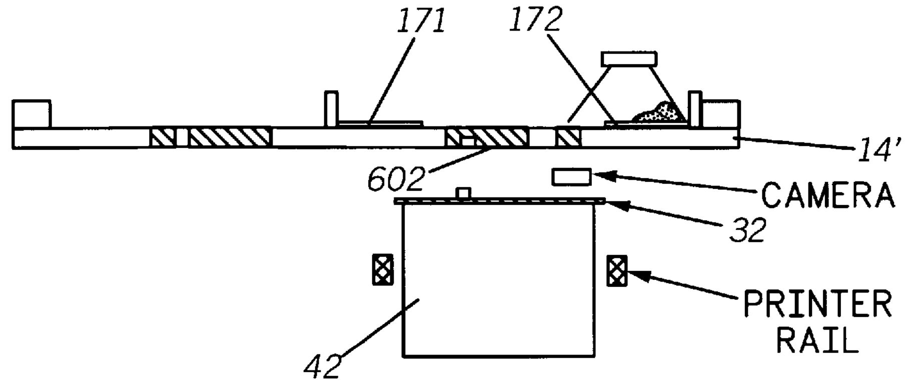
Figure 11:
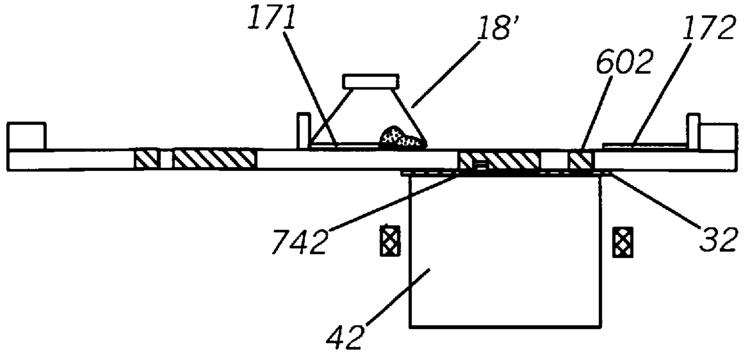
Figure 12:
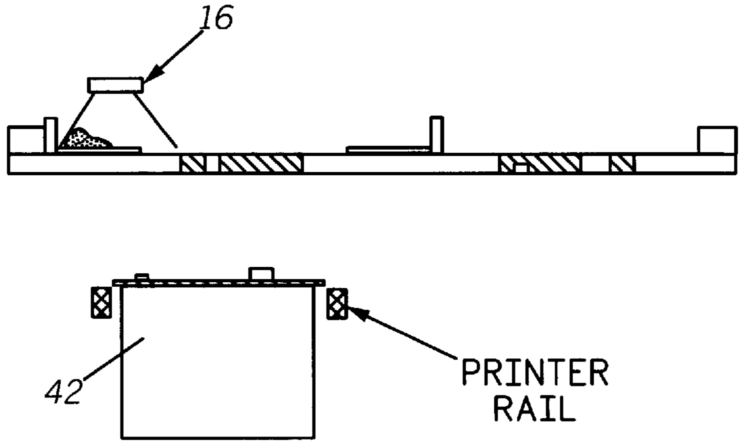

Referring to FIGS. 8–12, a two stage paste printing process advantageously uses the mix-pitch stencil 14' in accordance with the present invention for printing both solder sizes during a single printer rail pass of the printed circuit board. First, as seen in FIG. 8, the blank printed circuit board 32 is aligned into proper position over the vacuum tower 42 and under the stencil 14', by printer rail 44 with the guidance of vision camera 46. As seen in FIGS. 8–9, the printer will position the first sieve 601 over the blank substrate or PCB 32 by raising the PCB 32 from the printer rail 44 and using the vacuum tower or nestplate 42 to lift up the PCB 32 to print the solder mask pattern for the ultra fine pitch components by the first squeegee blade 18 moving a solder paste 17, initially deposited in a paste retainer 171, across the first sieve 60. After this first printing in FIG. 10, the substrate 32 will be lowered by the vacuum tower 42 or otherwise moved away to make room for the stencil 14' itself to be shifted or otherwise moved to a second position. For the second printing of FIG. 11, the second sieve 602 of the stencil is now positioned over the partially printed substrate 32 which is moved upwards toward the stencil for stencil printing the solder mask for the larger components by the second squeegee blade 18' which is used to move solder paste 17, deposited on a paste retainer 172, across the second sieve 602. The selectively positioned five mils blind-vias or cavities 742 from the bottom stencil surface will protect the first printed paste during this second printing. Hence, the second printing will print the mask for the larger components without smearing the first printing results which are still wet after both printings have been completed as seen in FIG. 12.

What is claimed is:

1. A method of forming a mixed-pitch stencil, comprising the following steps:

providing a first sieve portion;

forming, within the first sieve, at least a first through-hole of a first height from a first top surface portion of the stencil to a bottom surface of the stencil for dispensing solder deposits onto a substrate adjacent the bottom surface of the stencil;

providing a second sieve portion;

joining the first sieve portion to the second sieve portion;

forming, within the second sieve portion, at least a second through-hole of a second height from a second top surface portion of the stencil to the bottom surface of the stencil for dispensing solder deposits onto a substrate adjacent the bottom surface of the stencil;

forming at least one inverted well within the second sieve portion on the bottom surface of the stencil; and positioning and sizing the inverted well to covers the solder deposits dispensed onto the substrate from the first sieve portion.

2. A method of forming a stencil for dispensing solder onto a substrate, comprising the steps of:

providing a plate having first and second portions, the first and second portions differing in thickness;

forming a first set of vias disposed through the first portion through which one or more solder deposits of a first thickness can be dispensed onto an adjacent substrate;

forming a second set of vias disposed through the second portion through which one or more solder deposits of a second thickness can be dispensed onto an adjacent substrate;

forming at least one cavity within an underside of the second portion; and positioning and sizing the at least one cavity to cover the one or more of the solder deposits of the first thickness while the solder deposits of the second thickness are being dispensed.

* * * * *